United States Patent
Xu et al.

(10) Patent No.: US 11,394,306 B2
(45) Date of Patent: Jul. 19, 2022

(54) FLYBACK SWITCHING POWER SUPPLY, CONTROL SYSTEM THEREOF AND CONTROL METHOD THEREFOR

(71) Applicants: CSMC TECHNOLOGIES FAB2 CO., LTD., Wuxi New District (CN); SOUTHEAST UNIVERSITY, Nanjing (CN)

(72) Inventors: Shen Xu, Wuxi New District (CN); Wei Wang, Wuxi New District (CN); Feng Lin, Wuxi New District (CN); Boyong He, Wuxi New District (CN); Wei Su, Wuxi New District (CN); Weifeng Sun, Wuxi New District (CN); Longxing Shi, Wuxi New District (CN)

(73) Assignees: CSMC TECHNOLOGIES FAB2 CO., LTD., Wuxi New District (CN); SOUTHEAST UNIVERSITY, Xuanwu District Nanjing (CN)

( * ) Notice: Subject to any disclaimer, the term of this patent is extended or adjusted under 35 U.S.C. 154(b) by 162 days.

(21) Appl. No.: 16/915,524

(22) Filed: Jun. 29, 2020

(65) Prior Publication Data
US 2020/0328689 A1 Oct. 15, 2020

Related U.S. Application Data

(63) Continuation-in-part of application No. PCT/CN2018/125484, filed on Dec. 29, 2018.

(30) Foreign Application Priority Data

Dec. 29, 2017 (CN) .......................... 201711474042.9

(51) Int. Cl.
*H02M 3/335* (2006.01)
*G01R 19/165* (2006.01)
(Continued)

(52) U.S. Cl.
CPC ................. *H02M 3/33592* (2013.01); *G01R 19/16528* (2013.01); *H03K 5/24* (2013.01);
(Continued)

(58) Field of Classification Search
CPC ............ H02M 3/22; H02M 1/08; H02M 1/36; H02M 3/24; H02M 3/325; H02M 3/335;
(Continued)

(56) References Cited

U.S. PATENT DOCUMENTS 6,061,257 A * 5/2000 Spampinato ...... H02M 3/33523
363/21.13
6,078,510 A * 6/2000 Spampinato ...... H02M 3/33523
363/21.16
(Continued)

FOREIGN PATENT DOCUMENTS

CN 102185483 A 9/2011
CN 102751793 A 10/2012
(Continued)

OTHER PUBLICATIONS

International Search Report, and English Translation thereof, for International Application No. PCT/CN2018/125484, dated Mar. 27, 2019 (4 pages).
(Continued)

*Primary Examiner* — Thienvu V Tran
*Assistant Examiner* — Nusrat Quddus
(74) *Attorney, Agent, or Firm* — Kagan Binder, PLLC

(57) ABSTRACT

Provided is a dynamic control method that turns off a primary-side switching transistor when an output voltage exceeds an upper limit, and control the switching of a secondary-side synchronous rectification transistor with a fixed cycle and a fixed duty cycle. During the time that the synchronous rectification transistor is turned on, the energy of a load capacitor at the output end is extracted to the
(Continued)

primary side, which causes the output voltage to drop rapidly and the overshoot voltage to decrease greatly.

20 Claims, 7 Drawing Sheets

(51) Int. Cl.
*H03K 5/24* (2006.01)
*H02M 1/00* (2006.01)

(52) U.S. Cl.
CPC ........ *H02M 1/0006* (2021.05); *H02M 1/0009* (2021.05); *H02M 1/0012* (2021.05); *H02M 1/0025* (2021.05)

(58) Field of Classification Search
CPC ............... H02M 3/28; H02M 3/33569; H02M 3/33507; H02M 2007/4815; H02M 2007/4818; H02M 1/083; H02M 3/33538; H02M 3/33546; H02M 3/33515; H02M 3/33576; H02M 3/33592; H02M 3/33553; H02M 3/33523; H02M 1/32; H02M 2001/322; H02M 2001/327; H02M 1/34; H02M 2001/342; H02M 2001/344; H02M 2001/346; H02M 2001/348; H02M 1/38; H02M 1/42; H02M 1/4208; H02M 1/4216; H02M 1/4225; H02M 1/4233; H02M 1/4241; H02M 1/425; H02M 1/4258; H02M 1/4266; H02M 2001/4275; H02M 2001/4283; H02M 2001/4291; H02M 1/12; H02M 3/3155; H02M 7/1557; H02M 7/1626; H02M 7/53871; H02M 7/12; H02M 7/219; H02M 7/151; H02M 5/4585; H02M 7/217; H02M 7/1552; H02M 7/1623; H02M 3/073; H02M 3/10; H02M 3/135; H02M 3/137; H02M 7/10; H02M 7/00; H02M 7/06; H02M 7/064; H02M 7/068; G01R 19/165; G01R 19/16504; G01R 19/16509; G01R 19/16514; G01R 19/16519; G01R 19/16523; G01R 19/16528; G01R 19/16533; G01R 19/16538; G01R 19/16542; G01R 19/16547; G01R 19/16552; G01R 19/16557; G01R 19/16561; G01R 19/16566; G01R 19/16571; G01R 19/16576; G01R 19/1658; G01R 19/16585; G01R 19/1659; G01R 19/16595; G01R 19/17; Y02B 70/1491; G05F 1/30; G05F 1/33; G05F 1/32; G05F 1/34; G05F 1/38; G05F 1/52; H02J 7/12

See application file for complete search history.

(56) References Cited

U.S. PATENT DOCUMENTS

| | | | |
|---|---|---|---|
| 6,118,675 A * | 9/2000 | Lionetto | H02M 1/36 363/21.16 |
| 6,944,034 B1 * | 9/2005 | Shteynberg | H02M 1/4258 363/21.13 |
| 7,239,532 B1 * | 7/2007 | Hsu | H02M 3/33523 363/21.16 |
| 8,873,254 B2 | 10/2014 | Morris et al. | |
| 2006/0284567 A1 * | 12/2006 | Huynh | H02M 3/33507 315/246 |
| 2008/0094047 A1 * | 4/2008 | Huynh | H02M 3/33523 323/282 |
| 2008/0259656 A1 * | 10/2008 | Grant | H02M 3/33523 363/21.18 |
| 2009/0073725 A1 * | 3/2009 | Lin | H02M 3/33523 363/19 |
| 2011/0305048 A1 * | 12/2011 | Yang | H02M 1/083 363/21.03 |
| 2013/0169182 A1 * | 7/2013 | Park | H02M 3/33507 363/21.01 |
| 2014/0254211 A1 | 9/2014 | Luo | |
| 2015/0048755 A1 * | 2/2015 | Imanaka | H05B 45/382 363/21.13 |
| 2016/0329819 A1 * | 11/2016 | Chen | H02M 3/33592 |
| 2018/0034378 A1 * | 2/2018 | Lin | H02M 1/08 |
| 2018/0351462 A1 * | 12/2018 | Li | H02M 3/33507 |
| 2019/0089250 A1 * | 3/2019 | Liu | H02M 3/1582 |
| 2019/0252985 A1 * | 8/2019 | Radic | H02M 1/36 |

FOREIGN PATENT DOCUMENTS

| | | |
|---|---|---|
| CN | 103312176 A | 9/2013 |
| CN | 103683953 A | 3/2014 |
| CN | 104660054 A | 5/2015 |
| CN | 105071641 A | 11/2015 |
| JP | 2011160521 A | 8/2011 |
| WO | 2019129273 A1 | 7/2019 |
| WO | 2019129279 A1 | 7/2019 |

OTHER PUBLICATIONS

Chinese Office Action for Chinese Counterpart Application No. 201711474042.9, dated Aug. 24, 2020 (10 pages).
Unpublished Utility U.S. Appl. No. 16/959,015, filed Jun. 29, 2020 (No Copy Enclosed).
Unpublished Utility U.S. Appl. No. 16/958,868, filed Jun. 29, 2020 (No Copy Enclosed).

* cited by examiner

FLYBACK SWITCHING POWER SUPPLY, CONTROL SYSTEM THEREOF AND CONTROL METHOD THEREFOR

CROSS-REFERENCE TO RELATED APPLICATIONS

The present application is a Continuation-in-Part of International Application No. PCT/CN2018/125484 filed on Dec. 29, 2018, which claims priority to Chinese patent application No. 201711474042.9, filed on Dec. 29, 2017. Both applications are incorporated herein by reference in their entireties.

TECHNICAL FIELD

The present disclosure relates to a switching power converter, and more particularly to a flyback switching power supply, a control system, and a method for controlling the flyback switching power supply.

BACKGROUND

Switching power supplies are generally used as power sources for various types of electric devices, converting an unregulated AC or DC input voltage into a regulated AC or DC output voltage. Since the switching power supplies need to adapt to different working conditions, there has been increasingly higher requirements for the dynamic response of the power supplies. A good dynamic response requires a small voltage change and a short voltage recovery time.

Primary-side regulated (PSR) flyback converters are widely used in switching power supplies because of its simple structure, low cost and flexible control. There is a significant imbalance between the dynamic response of the PSR flyback converters and the actual demand. The output voltage may fluctuate greatly, particularly in the case of large load switching. In order to improve the dynamic response, researchers in the field of PSR flyback converters have proposed many innovative methods.

A digital multi-modes control algorithm has been proposed, which uses different modes for different load ranges and combines PWM and PFM. A fast and smooth switching can be achieved when the loads are switched in a small range. However, the control modes based on the algorithm can only be switched in sequence, which results in a slow response, a long responding time and a large overshoot voltage when the loads are switched in a large range.

In order to improve the dynamic response performance in the full load range, Chong Wang et al. (Novel digital control method for improving dynamic responses of multimode primary-side regulation flyback converter, IEEE Transactions on Power Electronics, 2017, 32(2): 1457-1468) have proposed a hybrid control method, in which a dynamic process detection module is introduced to the system. In addition to the steady-state multi-modes, two dynamic modes, i.e. light to heavy (LTH) mode and heavy to light (HTL) mode, are provided. A fixed cycle and a fixed duty cycle are adopted for controlling in the LTH and HTL modes. When the output voltage approaches the ideal value, the slope of the output voltage is used to determine the load point, so as to make sure the system enters into a correct steady-state mode. This solution effectively reduces the overshoot voltage and response time under discontinuous conduction mode (DCM) and improves the dynamic performance of the converter. However, there are still shortcomings. The recovery time is very long up to 53 ms when switching from a full load to an extremely light load.

In addition, in order to speed up the dynamic response, PI parameters are increased to speed up the compensation and thus the dynamic performance is improved according to some control methods. However, it brings limited improvements on dynamic performance for the situations when a multi-modes control is used.

SUMMARY

According to one aspect of the present disclosure, a control system for a flyback switching power supply is provided. The switching power supply includes a primary-side winding, a primary-side switching transistor coupled to the primary-side winding, a secondary-side winding, a secondary-side synchronous rectification transistor for rectifying an output voltage of the flyback switching power supply, and an auxiliary winding for providing output voltage feedback. The control system includes a sampling module configured to sample a resistance divided voltage Vsense of the auxiliary winding, and obtain a sampled output voltage Vo_sample according to the signal Vsense and obtain an error signal err between the signal Vo_sample and a rated output voltage $Vo_{\_REF}$; a multi-modes judgment module configured to receive the signal Vo_sample output by the sampling module and outputs a mode judgment signal mode_dynamic, wherein the value of the signal mode_dynamic is equal to 1 if the signal Vo_sample is greater or equal to a predetermined upper limit of output voltage Vomax, and the value of the signal mode_dynamic is equal to 0 if the signal Vo_sample is smaller than the upper limit Vomax; a dynamic control module configured to receive the signal mode_dynamic and output a duty cycle control signal Duty_SR_dynamic of the secondary-side synchronous rectification transistor when the signal mode_dynamic is equal to 1; a load point judgment module configured to receive the signal Vo_sample output by the sampling module and the signal mode_dynamic, and output a state judgment signal state_judge and a switching cycle Ts_judge when the signal Vo_sample drops to the rated output voltage $Vo_{\_REF}$, the multi-modes judgment module being configured to output a value of the state signal state corresponding to a steady-state mode upon receipt of the signal state_judge; a digital PID module configured to receive signals state and err and select a PID compensation algorithm according to the signal state, and calculate and output a control voltage compensation $V_{PI}$ according to the signal err and predetermined PI parameters Kp and Ki, the multi-modes judgment module adjusting the value of state according to the control voltage compensation $V_{PI}$; and a PWM drive module configured to turn off the primary-side switching transistor and switch the secondary-side synchronous rectification transistor with a fixed cycle $Ts_{\_HTL}$ and a fixed duty cycle $D_{HTL}$ upon receipt of the signal Duty_SR_dynamic, the PWM drive module controlling the switching of the primary-side switching transistor in the steady-state mode by taking Ts_judge as a value of a first cycle when receiving the signal Ts_judge, the PWM drive module calculating a duty cycle of the secondary-side synchronous rectification transistor according to the signal Vo_sample to perform switching of the secondary-side synchronous rectification transistor with a same cycle as in the primary-side switching transistor, the PWM drive module performing controlling of the primary-side switching transistor by means of a peak current control method based on the signal state and the control voltage compensation V after the first cycle.

According to another aspect of the present disclosure, a flyback switching power supply is provided, which includes a primary-side winding, a primary-side switching transistor coupled to the primary-side winding, a secondary-side winding, a secondary-side synchronous rectification transistor for rectifying an output voltage of the flyback switching power supply, an auxiliary winding for providing output voltage feedback, and a control system. The control system includes a sampling module configured to sample a resistance divided voltage Vsense of the auxiliary winding, and obtain a sampled output voltage Vo_sample according to the signal Vsense and obtain an error signal err between the signal Vo_sample and a rated output voltage Vo$_{\_REF}$; a multi-modes judgment module configured to receive the signal Vo_sample output by the sampling module and outputs a mode judgment signal mode_dynamic, wherein the value of the signal mode_dynamic is equal to 1 if the signal Vo_sample is greater or equal to a predetermined upper limit of output voltage Vomax, and the value of the signal mode_dynamic is equal to 0 if the signal Vo_sample is smaller than the upper limit Vomax; a dynamic control module configured to receive the signal mode_dynamic and output a duty cycle control signal Duty_SR_dynamic of the secondary-side synchronous rectification transistor when the signal mode_dynamic is equal to 1; a load point judgment module configured to receive the signal Vo_sample output by the sampling module and the signal mode_dynamic, and output a state judgment signal state_judge and a switching cycle Ts_judge when the signal Vo_sample drops to the rated output voltage Vo$_{\_REF}$, the multi-modes judgment module being configured to output a value of a state signal state corresponding to a steady-state mode upon receipt of the signal state_judge; a digital PID module configured to receive signals state and err and select a PID compensation algorithm according to the signal state, and calculate and output a control voltage compensation V$_{PI}$ according to the signal err and predetermined PI parameters Kp and Ki, the multi-modes judgment module adjusting the value of state according to the control voltage compensation V$_{PI}$; and a PWM drive module configured to turn off the primary-side switching transistor and switch the secondary-side synchronous rectification transistor with a fixed cycle Ts$_{\_HTL}$ and a fixed duty cycle D$_{TL}$ upon receipt of the signal Duty_SR_dynamic, the PWM drive module controlling the switching of the primary-side switching transistor in the steady-state mode by taking Ts_judge as a value of a first cycle when receiving the signal Ts_judge, the PWM drive module calculating a duty cycle of the secondary-side synchronous rectification transistor according to the signal Vo_sample to perform switching of the secondary-side synchronous rectification transistor with a same cycle as in the primary-side switching transistor, the PWM drive module performing controlling of the primary-side switching transistor by means of a peak current control method based on the signal state and the control voltage compensation V$_{PI}$ after the first cycle.

According to yet another aspect of the present disclosure, a method for controlling a flyback switching power supply is provided. The switching power supply includes a primary-side winding, a primary-side switching transistor coupled to the primary-side winding, a secondary-side winding, a secondary-side synchronous rectification transistor for rectifying an output voltage of the flyback switching power supply, and an auxiliary winding for providing output voltage feedback. The method includes: sampling a resistance divided voltage Vsense of the auxiliary winding; obtaining a sampled output voltage Vo_sample according to the signal Vsense and an error signal err between the signal Vo_sample and a rated output voltage Vo$_{\_REF}$; turning off a primary-side switching transistor and switching a secondary-side synchronous rectification transistor with a fixed cycle Ts$_{\_HTL}$ and a fixed duty cycle D$_{HTL}$ by a PWM drive module in a dynamic mode when Vo_sample≥Vomax, the system stepping out the dynamic mode and entering into a steady-state mode when the signal Vo_sample drops to Vo$_{\_REF}$; and obtaining a control voltage compensation V$_{PI}$ by a digital PID module by means of a PID compensation algorithm according to the signal err and predetermined PI parameters Kp and Ki in the steady-state mode, the PWM drive module calculating the cycle of the primary-side switching transistor according to the control voltage compensation V$_{PI}$ and calculating the duty cycle of the secondary-side synchronous rectification transistor according to the signal Vo_sample by means of a peak current control method, so as to perform switching of the primary-side switching transistor and the secondary-side synchronous rectification transistor with same cycles.

Details of one or more embodiments of the present disclosure are set forth in the accompanying drawings and description below. Other features, objects, and advantages of the disclosure will become apparent from the description, the drawings, and the claims.

BRIEF DESCRIPTION OF THE DRAWINGS

In order to more clearly illustrate the technical solutions in the embodiments or the exemplary technologies of the present disclosure, the drawings to be used in the description of the embodiments or the exemplary technologies will be briefly described below. Obviously, the described drawings are only representations of the embodiments of the present disclosure, and those skilled in the art can obtain drawings for other embodiments based on these drawings without any creative work.

DETAILED DESCRIPTION

The technical solutions of the present disclosure will be described clearly and thoroughly in combination with the drawings and embodiments.

In order to overcome the shortcomings and deficiencies of the prior art, the present disclosure proposes a flyback switching power supply, a control system for the flyback switching power supply, and a method for controlling the flyback switching power supply. When the load of the switching power supply is switched from a heavy load to a light load, the overshoot of the output voltage can be limited within a certain range, and the dynamic recovery time is significantly shortened, thereby improving the dynamic performance significantly. The method does not cause system instability in multi-modes control, and effectively reduces the overshoot of the voltage and dynamic recovery time, thereby leading to a better dynamic performance of the system.

Figure 1:
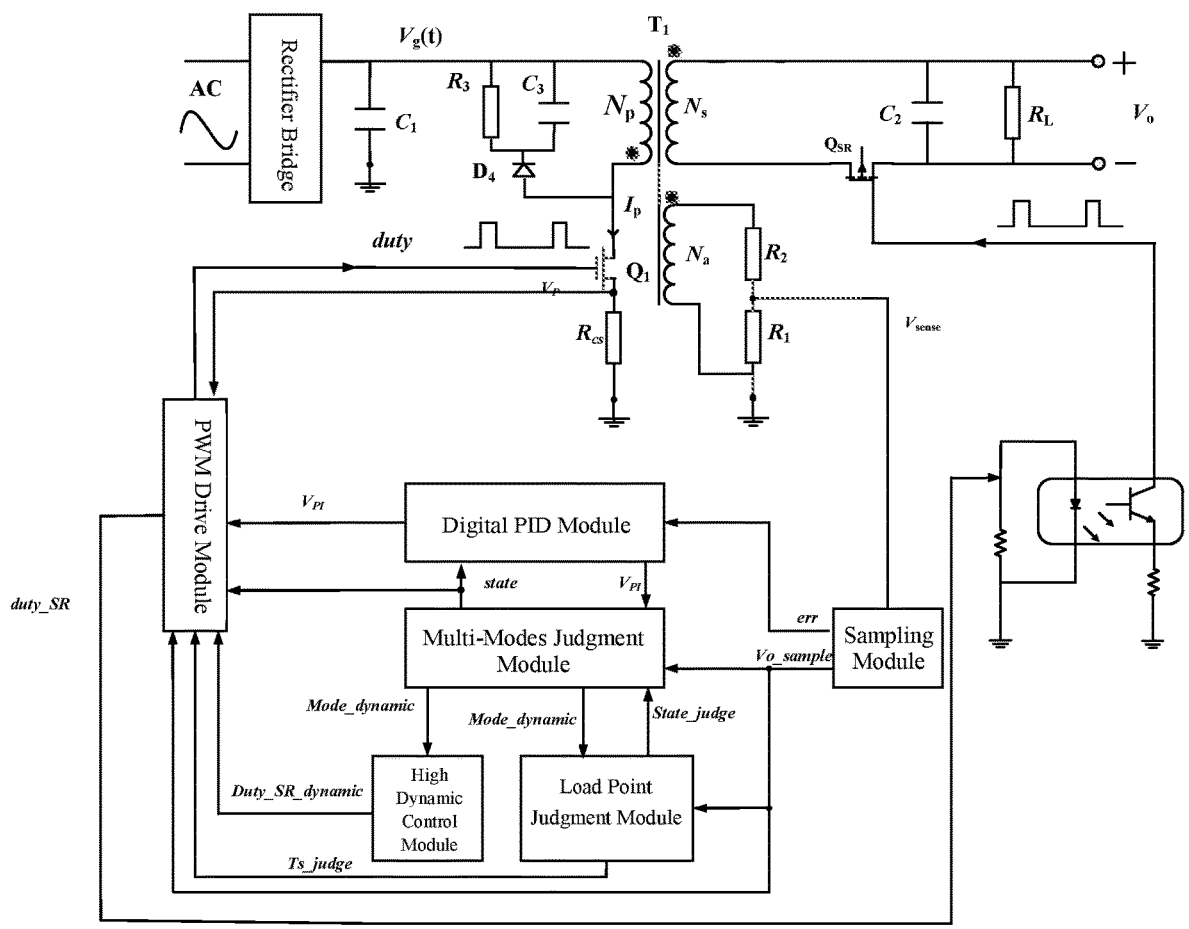
FIG. 1 is a diagram illustrating the structure of a switching power supply in accordance with an embodiment.

One aspect of the present disclosure provides a flyback switching power supply. FIG. 1 is a diagram showing the structure of a flyback switching power supply according to one embodiment of the present disclosure, in which a primary side of the flyback switching power supply has a main topology of primary-side regulation, and a secondary side of the flyback switching power supply has a synchronous rectification structure. Specifically, the primary side includes a primary-side winding and a primary-side switching transistor coupled to the primary-side winding, and the secondary side includes a secondary-side winding and a secondary-side synchronous rectification transistor (SR transistor) for rectifying an output voltage of the flyback switching power supply. The primary side may further include an auxiliary winding to provide output voltage feedback.

In the embodiment as shown in FIG. 1, the flyback switching power supply is an isolated type, i.e., the primary side and secondary side are coupled through windings to transmit energy between each other, but they are not electrically connected directly.

The flyback switching power supply further include a control system based on digital multi-modes control, which includes a sampling module, a multi-modes judgment module, a digital PID compensation module, a dynamic control module, a load point judgment module and a PWM drive module. These modules form a closed loop system with a controlled switching power supply.

The sampling module samples a resistance divided voltage Vsense of the auxiliary winding to obtain a current sampled output voltage Vo_sample. Feedback of the actual voltage output through the auxiliary winding is a prior art in the art, and will not be described in detail here. An error signal err (err=$V_{O\_REF}$–Vo_sample) of the sampled output voltage and a rated output voltage $V_{O\_REF}$ is then determined. The multi-modes judgment module receives the value of the sampled output voltage Vo_sample, and if Vo_sample is greater than or equal to a predetermined upper limit Vomax, the multi-modes judgment module outputs a dynamic mode judgment signal mode_dynamic with a value of 1, indicating that the system is in a heavy-to-light load switching state (HTL mode), and the dynamic mode judgment signal mode_dynamic is then input into the dynamic control module and the load point judgment module to perform high dynamic control. The dynamic control module receives the dynamic mode judgment signal mode_dynamic from the multi-modes judgment module. The dynamic control module turns off the primary-side switching transistor by the PWM driving module and output a duty cycle signal Duty_SR_dynamic of the SR transistor to the PWM drive module when the value of the signal mode_dynamic is 1. The output voltage drops rapidly by controlling the SR transistor to be switched with a fixed duty cycle. The load point judgment module receives the sampled output voltage Vo_sample from the sampling module in the HTL mode, and calculates a dropping slope Kdown of the output voltage. The current load is then determined according to the slope, based on which a steady-state mode that the system should be in after the dynamic process, as well as a switching cycle Ts_judge and a primary-side peak current of the steady-state mode are further determined. In an embodiment, the system enters into a DPFM steady-state mode after the dynamic process, in which the peak current is fixed. The load point judgment module outputs a step-out state judgment signal state_judge to the multi-modes judgment module, and outputs the current switching cycle Ts_judge to the PWM drive module. A steady state is then achieved which uses a conventional digital PID control. In the dynamic mode HTL, the PWM drive module turns off the primary-side switching transistor and receives the duty cycle signal Duty_SR_dynamic. Also, the PWM drive module controls the switching of the SR transistor with a fixed cycle and a fixed duty cycle, and obtains the PWM waveforms that regulate the primary-side switching transistor and the SR transistor. When the PWM drive module is in the steady state, a peak current control is adopted.

Figure 2:
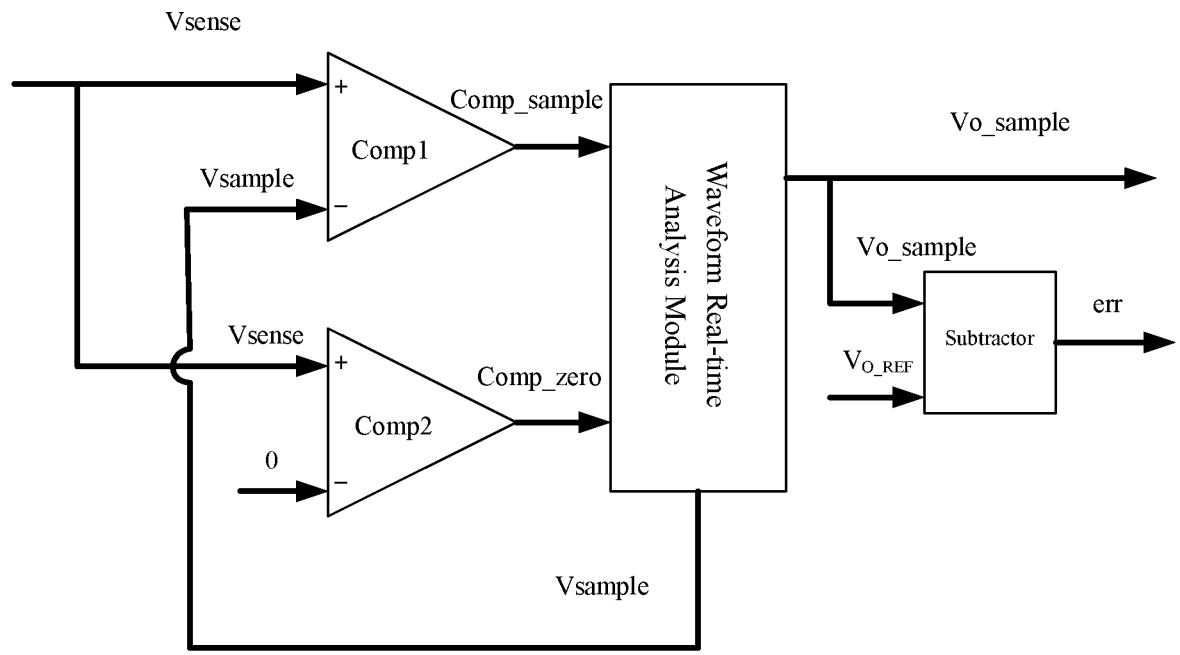
FIG. 2 is a diagram illustrating the structure of a sampling module in accordance with an embodiment.

FIG. 2 shows an structure of the sampling module according to one embodiment. The sampling module samples the resistance divided voltage Vsense of the auxiliary winding. The sampling module includes two comparators COMP1 and COMP2, a waveform real-time analysis module and a subtractor. The resistance divided voltage Vsense of the auxiliary winding is input into the positive terminal of COMP1 and an internal sampling signal Vsample from the waveform real-time analysis module is input into the negative terminal of COMP1. The current value of the internal sampling signal Vsample is determined to be the inflection point value of the resistance divided voltage Vsense or not according to the output result of the comparator COMP. The sampled output voltage Vo_sample is assigned by the internal sampling signal Vsample, and then the internal sampling signal Vsample is dynamically adjusted according to the output result of the comparator COMP1 for the next sampling. The resistance divided voltage Vsense is also input to the positive terminal of COMP2 while the negative terminal of COMP2 is coupled to zero level. The waveform real-time analysis module outputs the internal sampling signal Vsample and the value of the sampled output voltage Vo_sample according to the results of the two comparators. Vo_sample is input into the negative terminal of the subtractor, and the rated output voltage $V_{O\_REF}$ is input into the positive terminal of the subtractor, so that an error signal err (err=$V_{O\_REF}$–Vo_sample) is obtained. The voltage waveform of the resistance divided voltage Vsense is input into the sampling module and compared with the signal Vsample and 0 by two comparators COMP1 and COMP2, respectively, and two signals comp_sample and comp_zero are then obtained. The waveform real-time analysis module analyzes the output signals of the two comparators to obtain the value of the current sampled output voltage Vo_sample, and adjusts the value of the internal sampling signal Vsample to prepare for the next sampling. The value of the error signal err is obtained by subtracting Vo_sample from the rated output voltage $V_{O\_REF}$ (a fixed Value).

Figure 3:
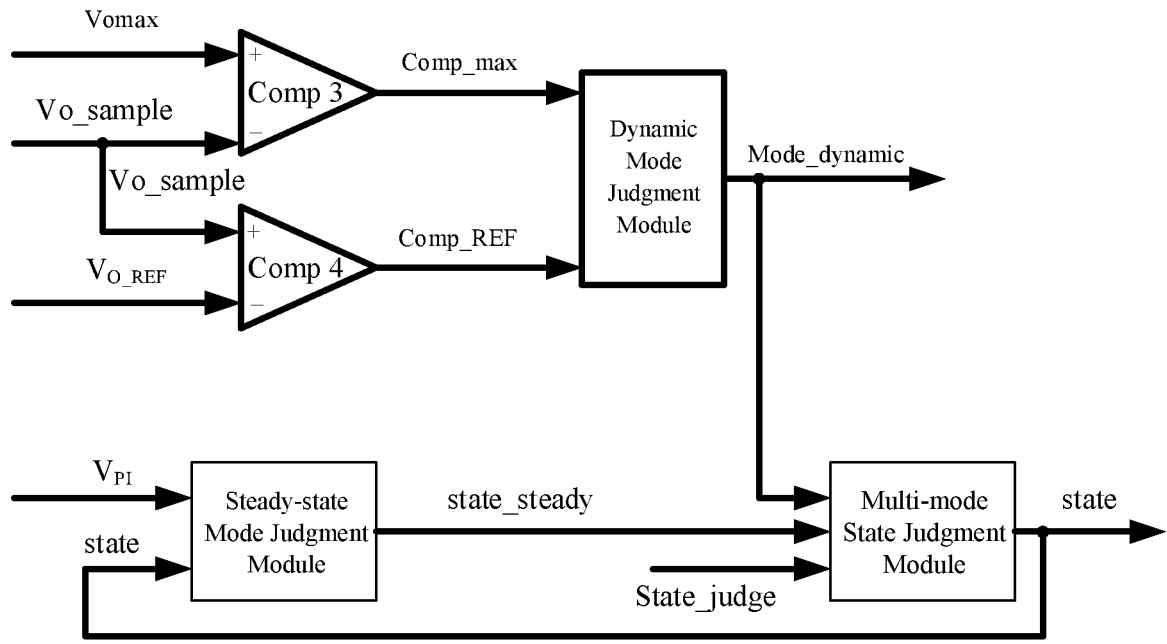
FIG. 3 is a diagram illustrating the structure of a multi-modes judgment module in accordance with an embodiment.

FIG. 3 shows a structure of the multi-modes control module according to one embodiment. The multi-modes control module receives the sampled output voltage Vo_sample output by the sampling module. The multi-modes control module includes two comparators COMP3 and COMP4, a dynamic mode judgment module, a steady-state mode judgment module, and a multi-modes state judgment module. The positive terminal of the comparator COMP3 is coupled to a predetermined upper limit of output voltage Vomax, and the negative terminal of the comparator COMP3 is coupled to the signal Vo_sample. The positive terminal of comparator COMP4 is coupled to the signal Vo_sample, while the negative terminal of the comparator COMP4 is coupled to a predetermined rated voltage $V_{O\_REF}$. The dynamic mode judgment module outputs the dynamic mode judgment signal mode_dynamic according to the results of the two comparators. A control voltage compensation $V_{PI}$ and a state signal state are input into the steady-state mode judgment module, and the steady-state mode judgment module outputs a steady state signal state_steady. Specifically, the output voltage Vo_sample sampled by the sampling module is compared with the predetermined upper limit Vomax of the output voltage and the rated output voltage $V_{O\_REF}$ respectively by the comparators, and the comparison results are input into the dynamic mode judgment module for analysis. If Vo_sample≥Vomax, then mode_dynamic=1, indicating that the system enters into the dynamic mode and the current signal state=state_HTL. In the dynamic mode, when Vo_sample drops to $V_{O\_REF}$, the signal mode_dynamic becomes zero, and the system steps out the dynamic mode. The specific steady-state mode that the system is to enter into is determined according to the signal state_judge, and the current signal state=state_judge. In the steady-state mode, the signal mode_dynamic=0, and the steady-state mode judgment module performs mode judgment according to the current state signal state and the value of the digital compensation $V_{PI}$ to output the signal state_steady of the next mode and assigns a value to the signal state. A control mode is determined according to a value of a state signal state output by the multi-modes state judgment module, and the control mode is selected from the CCM (continuous conduction mode), PWM (pulse width modulation), PFM (pulse frequency modulation), DPWM (digital pulse width modulation), or DPFM (digital pulse frequency modulation).

Figure 4:
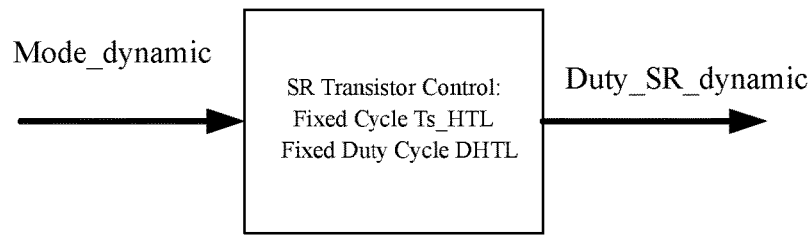
FIG. 4 is a diagram illustrating the structure of a high dynamic control module in accordance with an embodiment.

FIG. 4 shows a structure of the high dynamic control module according to one embodiment. The dynamic control module is a high dynamic control module, since the system enters into a dynamic mode when the dynamic mode judgment signal Mode_dynamic=1. The high dynamic control module receives the dynamic mode judgment signal Mode_dynamic output by the multi-modes judgment module. If Mode_dynamic=1, the system enters into the dynamic mode. In the dynamic mode, the primary-side switching transistor keeps off and no energy is input, so only the SR transistor of the secondary side needs to controlled with a fixed cycle $Ts_{HTL}$ and a fixed duty cycle $D_{HTL}$. Thus, the high dynamic control module only outputs the PWM signal Duty_SR_dynamic for the gate of the secondary-side SR transistor.

Figure 5:
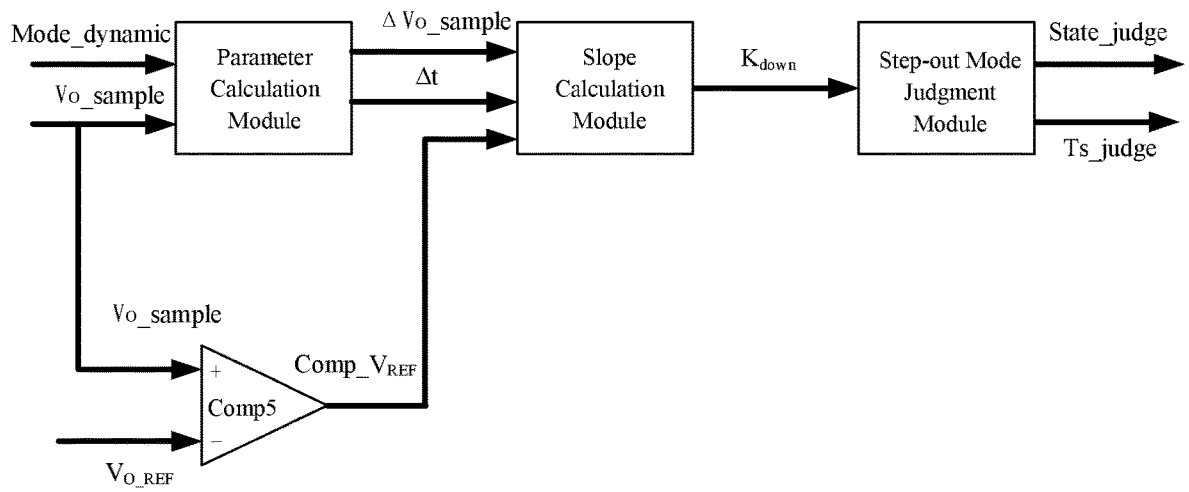
FIG. 5 is a diagram illustrating the structure of a load point judgment module in accordance with an embodiment.

FIG. 5 shows a structure of a load point judgment module according to one embodiment, which includes a comparator COMP5, a parameter calculation module, a slope calculation module, and a step-out mode judgment module. The positive terminal of the comparator COMP5 is coupled to Vo_sample, while the negative terminal is coupled to the rated output voltage $Vo_{\_REF}$. The comparator COMP5 outputs a reference voltage comparison signal Comp_$V_{REF}$. In an embodiment, the comparator COMP5 can be replaced by the comparator COMP4 as described before. The input of the parameter calculation module is the dynamic mode judgment signal Mode_dynamic and the sampled output voltage Vo_sample, and the output is the value of the output voltage change ΔVo_sample and the corresponding time Δt. The input of the slope calculation module is ΔVo_sample, Δt and Comp_$V_{REF}$, and the output is the voltage dropping slope Kdown. The input of the step-out mode judgment module is Kdown, and the output is the step-out state judgment signal state_judge and the current switching cycle Ts_judge. In the dynamic mode, state=HTL. The parameter calculation module performs a counting by a counter to obtain Δt, i.e., the time from entry into the dynamic mode to stepping out of the dynamic mode, and further obtains a change ΔVo_sample over Δt according to the input Vo_sample. The slope calculation module captures the time point when Vo_sample drops to $Vo_{\_REF}$ by analyzing the output of the comparator Comp_$V_{REF}$, and then calculates the slope Kdown of the output voltage. The step-out mode judgment module then determines the mode state_judge of the system after stepping out of the dynamic state and the switching cycle Ts_judge of the first cycle according to the value of Kdown. The step-out state judgment signal state_judge and the switching cycle signal Ts_judge after stepping-out are valid only when stepping out the dynamic mode.

Figure 6:
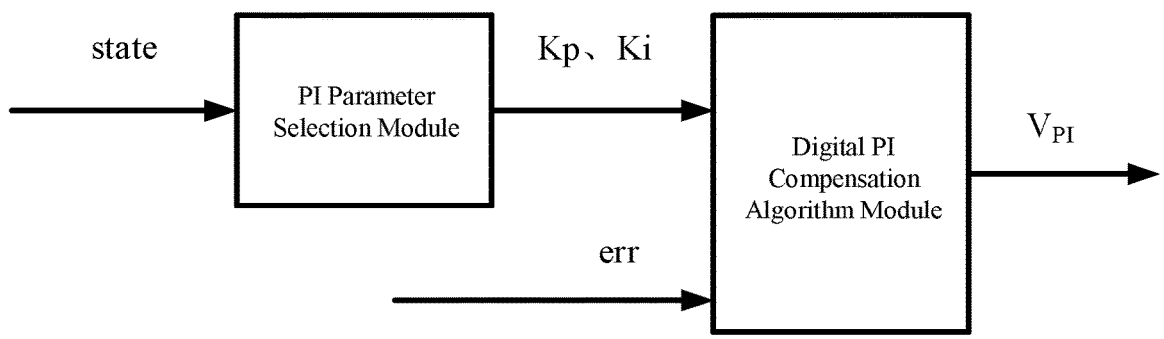
FIG. 6 is a diagram illustrating the structure of a digital PID module in accordance with an embodiment.

FIG. 6 shows a structure of a digital PID compensation module according to an embodiment, which includes a PI parameter selection module and a digital PI compensation algorithm module. The input of the PI parameter selection module is the state signal state, and the output is PI parameters, i.e., proportional control factors Kp and integral control factors Ki. The input of the digital PI compensation algorithm module is Kp, Ki and the error signal err, and the output is the control voltage compensation $V_{PI}$. The present disclosure uses the PID compensation algorithm, but only P adjustment and I adjustment are used, and D adjustment is not used. In the steady-state mode, different parameters Kp and Ki are selected depending on different modes, and are input into the subsequent digital PI compensation algorithm module together with the current output voltage error err to calculate the control voltage compensation $V_{PI}$ for the next cycle. The digital PID compensation module is idle in the dynamic mode.

Figure 7:
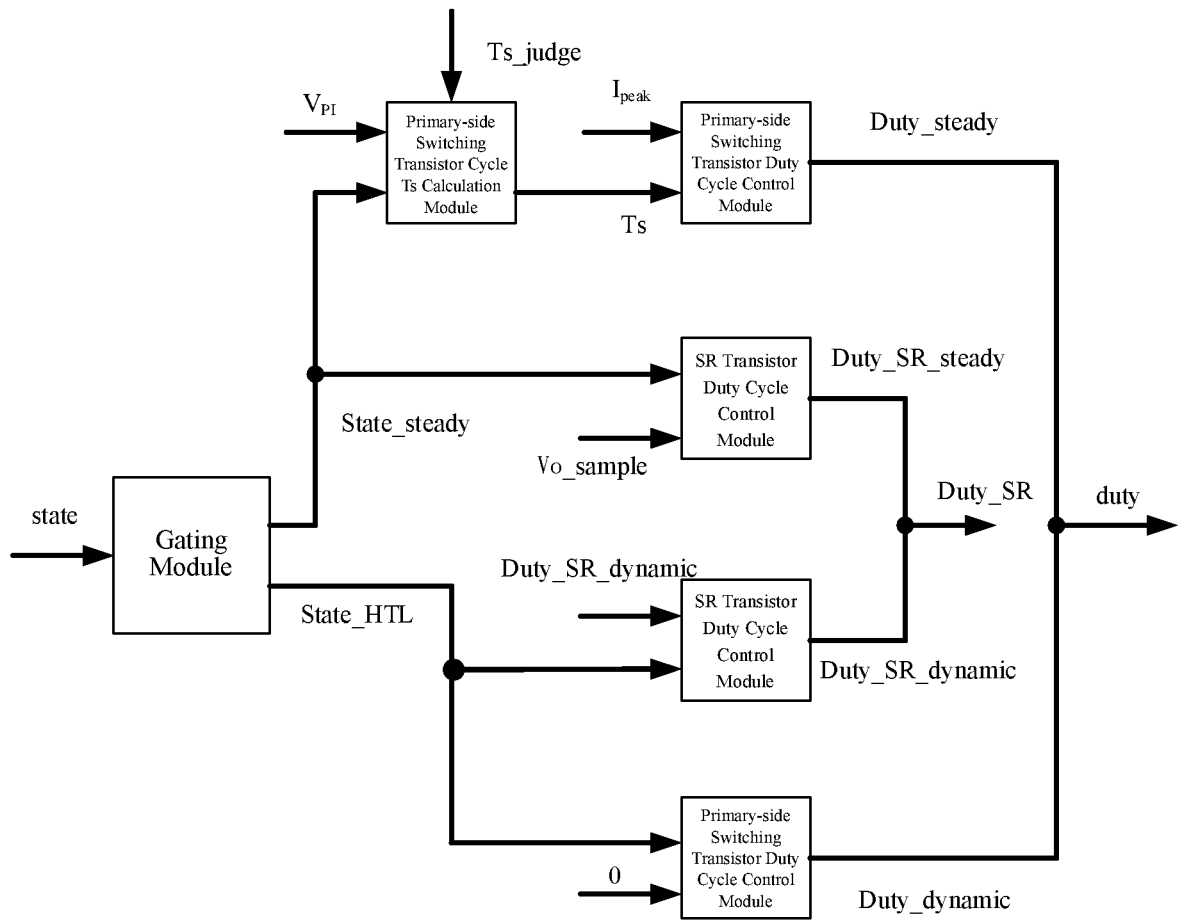
FIG. 7 is a diagram illustrating the structure of a PWM drive module in accordance with an embodiment.

FIG. 7 shows a structure of the PWM drive module according to an embodiment, which includes a gating module, a primary-side switching transistor cycle Ts calculation module, a primary-side switching transistor duty cycle control module and a SR transistor duty cycle control module. The state signal state is input into the gating module, and two signals are obtained: a dynamic state signal State_HTL and a steady state signal State_steady. The gating module determines whether the current mode state should be a steady-state mode state_steady or a dynamic mode State_HTL. If the gating module outputs State_HTL, the input of the primary-side switching transistor duty cycle control module is State_HTL and 0, and the output is primary-side switching transistor dynamic duty cycle signal duty which is equal to Duty_dynamic. The input signals of the synchronous rectifier SR transistor duty cycle control module include State_HTL and Duty_SR_dynamic output by the high dynamic control module, and the output is the synchronous rectification SR transistor duty cycle signal Duty_SR which is equal to Duty_SR_dynamic. If the gating module outputs State_steady, the input signals of the primary switching transistor cycle Ts calculation module include $V_{PI}$, State_steady and Ts_judge, and the output is the primary-side switching transistor cycle signal Ts. The signal Ts and primary-side peak current Ipeak are input to the primary-side switching transistor duty cycle control module which then outputs the primary-side switching transistor duty cycle signal duty which is equal to Duty_steady. State_steady and Vo_sample are input to the SR transistor duty cycle control module which thereby outputs a SR transistor duty cycle signal Duty_SR which is equal to Duty_SR_steady.

In the dynamic mode HTL, the primary-side switching transistor keeps off, and the PWM signal duty input into the gate of the primary-side switching transistor is equal to zero. The PWM signal Duty_SR that is input into the gate of the SR transistor is Duty_SR_dynamic which is provided by the high dynamic control module.

After the system steps out a dynamic state and enters into a steady state, the first switching cycle Ts of the primary-side switching transistor is Ts_judge which is provided by the load point judgment module. The calculation of the subsequent switching cycles Ts is same as in the steady-state mode.

The peak current control is adopted in the steady-state mode. The cycles Ts of the primary-side switching transistor in the PFM and DPFM mode are calculated according to the digital compensation $V_{PI}$. The rest of the steady-state modes have fixed cycles. When the value of a cycle counter is 0, duty=1 and the primary-side switching transistor is turned on. When the primary-side current reaches the peak current, duty=0 and the primary-side switching transistor is turned off until the value of the cycle counter becomes zero again. This step is repeatedly performed as above.

In the steady state, the cycle of the secondary-side synchronous rectification transistor (SR transistor) is equal to the cycle of the primary-side switching transistor. When the primary-side switching transistor is turned off, Duty_SR=1 and the SR transistor is turned on. The SR transistor duty cycle control module calculates a time Ton_sr that the SR transistor keeps on according to the current output voltage Vo_sample. When the state of Duty_SR=1 lasts for this time, the SR transistor is turned off and Duty_SR=0. This step is repeatedly performed as above.

The advantages and effects of the present disclosure includes:

1. The dynamic control method proposed in this disclosure turns off the primary-side switching transistor when the output voltage exceeds an upper limit, and control the switching of the secondary-side synchronous rectification transistor with a fixed cycle and a fixed duty cycle. During the time that the synchronous rectification transistor is turned on, the energy of a load capacitor at the output end is extracted to the primary side, which causes the output voltage to drop rapidly and the overshoot voltage to decrease greatly, and also reduces the dynamic recovery time to 2.5 ms.

2. The dynamic control method proposed in this disclosure calculates the slope of the output voltage dropping from an upper limit to a rated value in the heavy-to-light load mode, and obtains the value of the load based on the monotonic correspondence between the slope and the load. The energy is not much different from the steady-state consumption of the load after the system steps out the HTL mode and enters into a steady state corresponding to the load point, thereby eliminating the potential voltage oscillations and reducing the dynamic recovery time. In addition, the value of the load after the stepping-out is determined by the slope, which avoids a large voltage resonance otherwise caused by the large difference between the energy and the steady-state consumption of the load after the stepping-out, and avoids a large oscillation otherwise caused by the HTL mode. Therefore, a more stable circuit is realized.

3. The present disclosure involves a heavy-to-light load mode, i.e. a HTL mode and a method of determining a load point based on a digital multi-modes control, which will not affect the stability of a common multi-modes control loop.

4. The present disclosure can be applied to a switching power supply circuit with synchronous rectification, and can be used widely and repeatedly.

The flyback power supply converter in one example has an input voltage range of 90~265V and a constant output voltage of 20V. The maximum output current is 5 A. The transformer inductance is 417 µH, and the turn ratio of the transformer is 45 (primary-side windings): 8 (secondary-side windings): 4 (auxiliary windings). The clock frequency is 20 MHz. When judging the load point, the relationship between the output load, the voltage dropping slope Kdown and the corresponding working state are shown in Table 1.

TABLE 1

Stepping-out Modes Corresponding to Different Slops Kdown in HTL Modes

| Kdown(mV/µs) | Load(Ω) | Mode | Ts_judge/µs | Ipeak/A |
|---|---|---|---|---|
| ~2.65 | 700~ | DPFM | 543 | 1.530 |
| 2.65~3.18 | 500~700 | DPFM | 409 | 1.530 |
| 3.18~4.25 | 300~500 | DPFM | 335 | 1.530 |
| 4.25~5.32 | 150~300 | DPFM | 196 | 1.530 |
| 5.32~ | ~150 | DPFM | 121 | 1.530 |

The above are the specific parameters of the exemplary 20V/5 A primary-side regulated flyback power supply converter.

Figure 8:
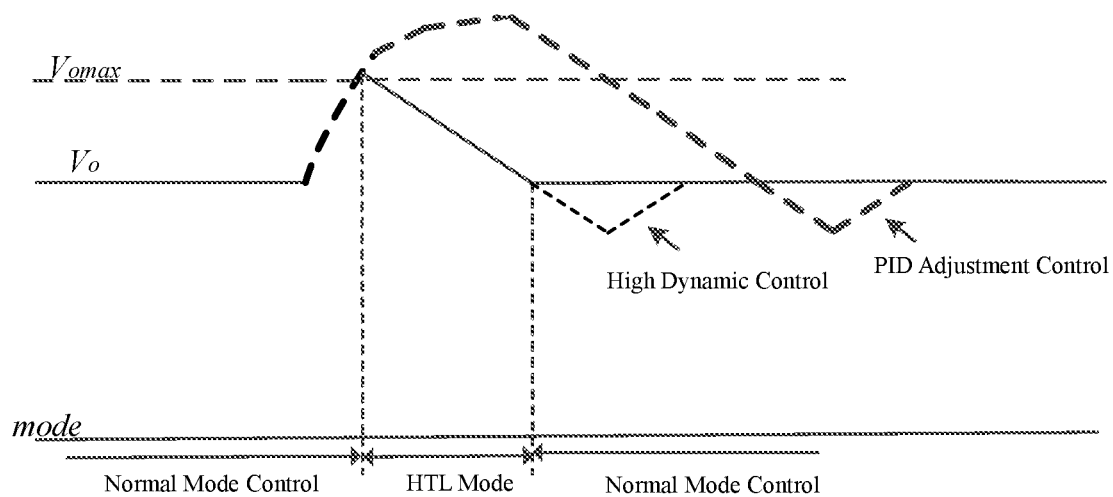
FIG. 8 is a schematic diagram of an application of a heavy-to-light load switching mode in accordance with an embodiment.

Referring to FIG. 8, when switching from a heavy load to a light load, it can be seen from the diagram that the HTL mode is used when the output voltage is greater than Vomax. If PID adjustment is used, as shown by the thick dashed line, the voltage will continue to increase after it rises to Vomax, and the dynamic recovery time is very long. The HTL mode if desired will be adopted immediately after the output voltage becomes greater than Vomax. In this mode, the primary-side switching transistor is turned off and the switching of the secondary-side synchronous rectification transistor is controlled with a fixed cycle and a fixed duty cycle. During the time when the synchronous rectification transistor is on, the energy of the load capacitor at the output end is extracted to the primary side, which causes the output voltage to drop rapidly. When the output voltage drops to a rated value, the output load can be obtained by the slope so as to make sure that the output energy in a steady state mode following the HTL mode is close to the consumption of the load, and the resonance otherwise caused by energy mismatch is therefore eliminated, as shown by the solid line. It can also be seen that if the output energy is too low due to improper conditions after stepping out the HTL mode, a voltage resonance may be introduced, as shown by the thin dotted line.

Figure 9:
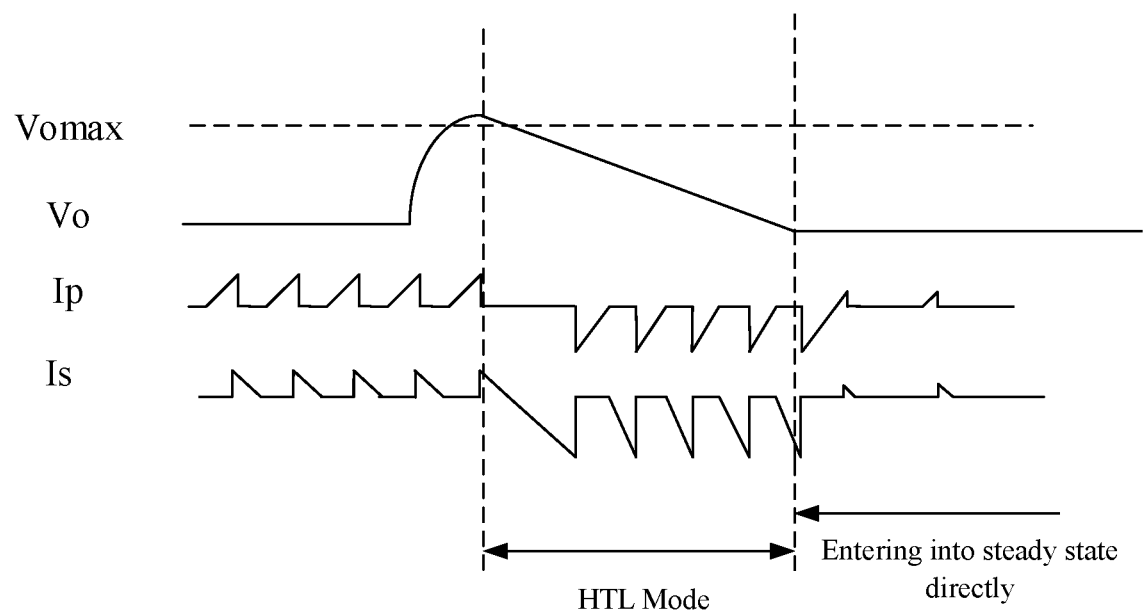
FIG. 9 is a waveform diagram of an output voltage, a primary-side current and a secondary-side current in a heavy-to-light load switching mode in accordance with an embodiment.

FIG. 9 shows key waveforms of the output voltage Vo, the primary-side current Ip, the secondary-side current Is and the resistance divided voltage Vsense of the auxiliary winding when switching from a heavy load to a light load. The system enters into the HTL mode with the primary-side switching transistor being turned off when the output voltage is greater than Vomax, and only the secondary-side synchronous rectification transistor is operated with a fixed cycle Ts_HTL and a fixed duty cycle $D_{HTL}$.

The secondary-side current Is increases linearly inversely and forms a negative current when the synchronous rectification transistor is turned on. Is reaches a maximum value when the synchronous rectification transistor is turned off. During this process, the energy of the load capacitor at the output end is extracted and stored in an excitation inductor, which decreases the output voltage rapidly. Meanwhile, sampling is performed during the time when the synchronous rectification transistor is turned on. The waveform of Vsense of the auxiliary winding is also shown in the figure.

The energy stored in the excitation inductor is transmitted to the primary side when the synchronous rectification transistor is turned off, forming a negative current on the primary side. The energy is then returned to the input voltage network through the body diode of the primary-side switching transistor, making the negative current of the primary side decreases to zero gradually. The energy extracted from the secondary-side load capacitor is therefore released.

The above process can be repeated by controlling the switching of the secondary-side synchronous rectification transistor. The switching of the synchronous rectification transistor is performed with a fixed cycle Ts_HTL and a fixed duty cycle $D_{HTL}$ to quickly reduce the stored energy in the load capacitor at the output end, which decreases the output voltage rapidly and further makes the system enter into a corresponding steady-state mode.

Figure 10:
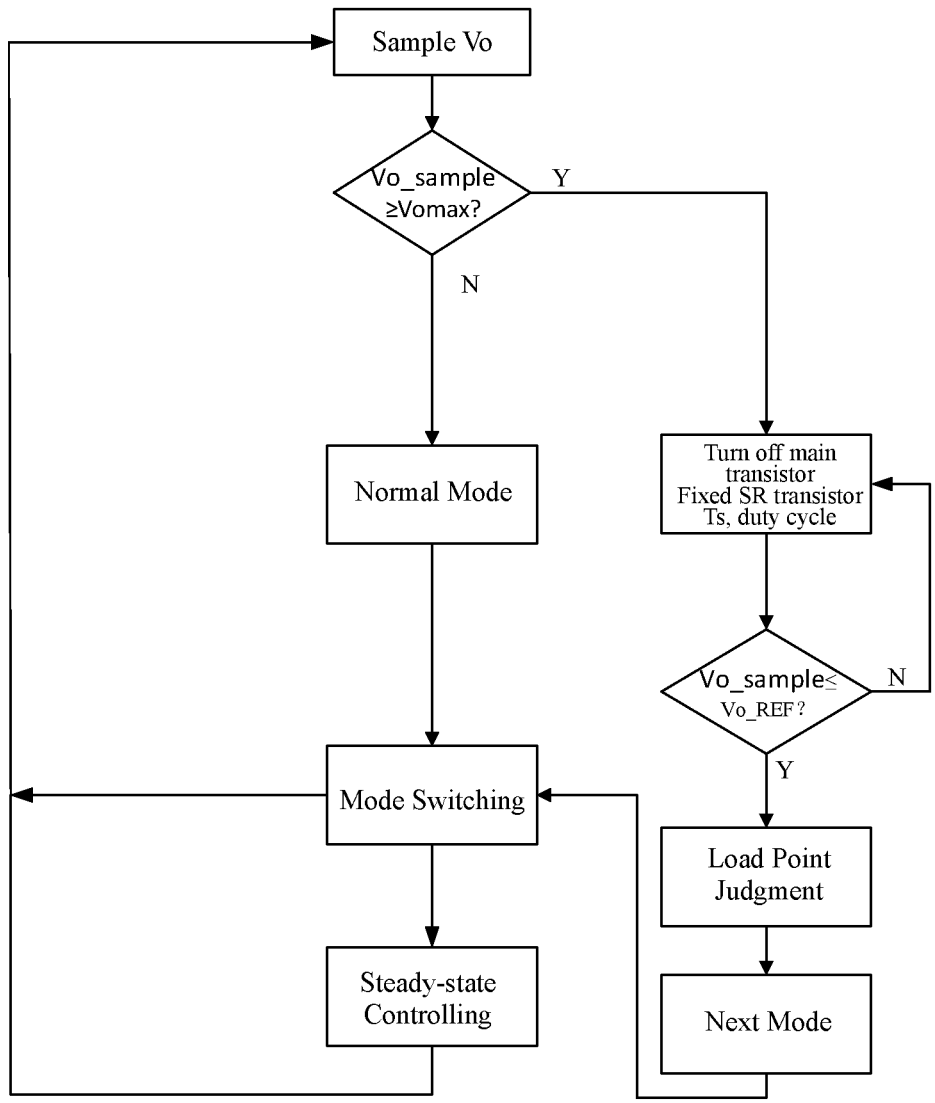
FIG. 10 is a flowchart of a high dynamic control algorithm of the present disclosure in accordance with an embodiment.

Another aspect of the present disclosure provides a method for controlling a flyback switching power supply. FIG. 10 is a flowchart of the control method according to one embodiment of the present disclosure. As shown in the figure, the waveform of the voltage on the auxiliary winding is first sampled, and then mode judgment is performed to determine whether the system enters into the dynamic mode. If the system enters into the dynamic mode, the primary-side switching transistor is turned off, and the synchronous rectification transistor is operated with a fixed cycle Ts_HTL and a fixed duty cycle $D_{HTL}$, which decreases the output voltage with a fixed slope (the voltage dropping slope keeps unchanged provided that the load does not change). At the same time, the output voltage is sampled with the help of the waveform of Vsense of the auxiliary winding during the time when the SR transistor is turned on and input into the load point judgment module when it drops to the rated voltage. According to the time Δt during which the output voltage drops, the slope Kdown of the drop is calculated, and the corresponding load point is thereby obtained. The system then enters into a corresponding steady-state mode based on the value of the load. The system quits the high dynamic control mode now, and enters into the steady-state mode with the output voltage being stabilized at the rated value. The digital PID compensation algorithm is subsequently used for conventional digital multi-modes control. For the connection relationship between the modules involved in the above steps and the corresponding working principles, reference may be made to the previous descriptions of the modules of the flyback switching power supply, which will not be repeated here.

The above is only a description of the steps of the control method of one embodiment, and is not used to limit the order of steps. Those skilled in the art can appropriately adjust the order of the corresponding steps according to the description of this application.

Figure 11:
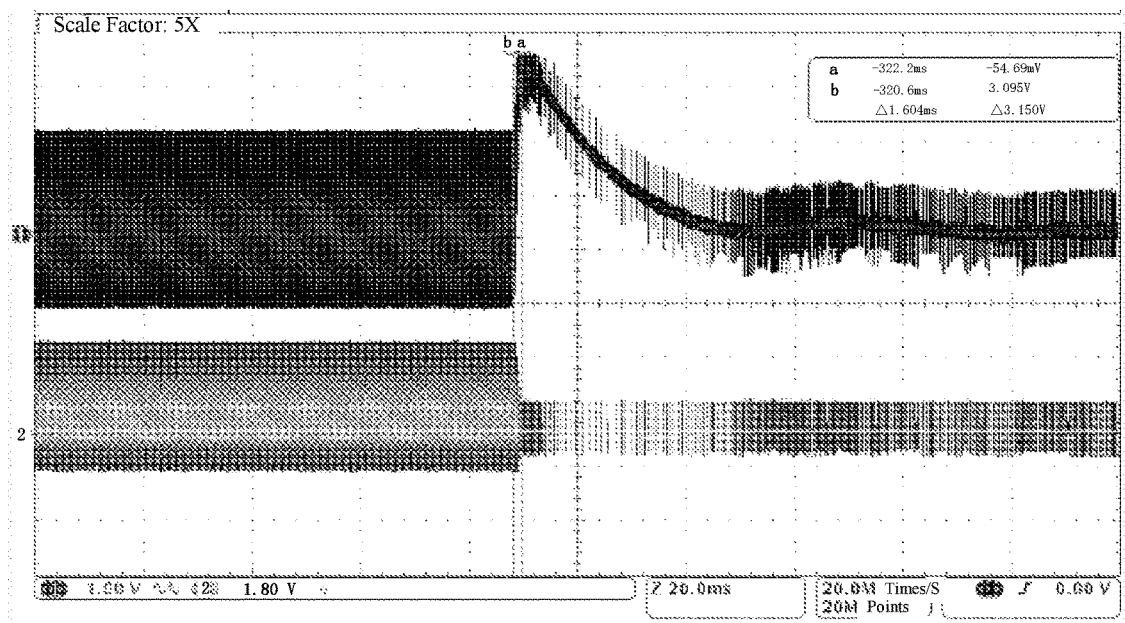
FIG. 11 shows a dynamic result without a high dynamic control algorithm of the present disclosure adopted when the load is switched from 4Ω to 800Ω.

FIG. 11 shows the dynamic result when the load is switched from 4Ω to 800Ω in the case that the high dynamic algorithm of the present disclosure is not applied. It can be seen from the figure that, when a conventional digital multi-modes control algorithm is used, a large overshoot voltage of the output voltage of 3.150V is introduced, and a long dynamic recovery time of 64.32 ms is taken. Moreover, there will be voltage fluctuations when the output voltage drops to the rated value, thereby resulting in poor dynamic performance.

Figure 12:
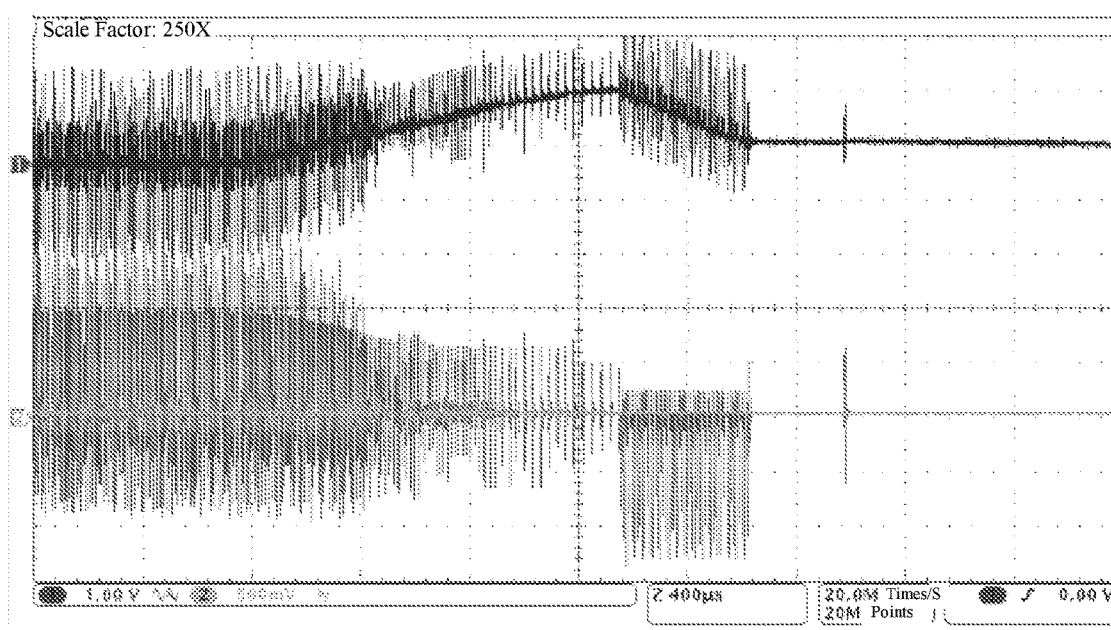
FIG. 12 shows a dynamic result with a high dynamic control algorithm of the present disclosure adopted when the load is switched from 4Ω to 800Ω.

FIG. 12 shows the dynamic result when the load is switched from 4Ω to 800Ω using the high dynamic algorithm of the present disclosure. This is only an embodiment of the present disclosure. As can be seen from the figure, when using a high dynamic control algorithm, the overshoot voltage of the output voltage is 1.343V and the dynamic recovery time is 1.888 ms, which effectively reduces the overshoot voltage and greatly reduces the dynamic recovery time. In addition, there is no voltage fluctuation when the output voltage drops to the rated value and the load point can be accurately determined, which greatly improves the dynamic performance when switching from a heavy load to a light load.

The invention claimed is:

1. A control system for a flyback switching power supply, the switching power supply comprising a primary-side winding, a primary-side switching transistor coupled to the primary-side winding, a secondary-side winding, a secondary-side synchronous rectification transistor for rectifying an output voltage of the flyback switching power supply, and an auxiliary winding for providing output voltage feedback, wherein the control system comprises:
   a sampling module configured to sample a resistance divided voltage Vsense of the auxiliary winding, and obtain a sampled output voltage Vo_sample according to the signal Vsense and obtain an error signal err between the signal Vo_sample and a rated output voltage $Vo_{\_REF}$;
   a multi-modes judgment module configured to receive the signal Vo_sample output by the sampling module and outputs a mode judgment signal mode_dynamic, wherein the value of the signal mode_dynamic is equal to 1 if the signal Vo_sample is greater or equal to a predetermined upper limit of output voltage Vomax, and the value of the signal mode_dynamic is equal to 0 if the signal Vo_sample is smaller than the upper limit Vomax;
   a dynamic control module configured to receive the signal mode_dynamic and output a duty cycle control signal Duty_SR_dynamic of the secondary-side synchronous rectification transistor when the signal mode_dynamic is equal to 1;
   a load point judgment module configured to receive the signal Vo_sample output by the sampling module and the signal mode_dynamic, and output a state judgment signal state_judge and a switching cycle Ts_judge when the signal Vo_sample drops to the rated output voltage $Vo_{\_REF}$, the multi-modes judgment module being configured to output a value of a state signal state corresponding to a steady-state mode upon receipt of the signal state_judge;
   a digital PID module configured to receive the signals state and err and select a PID compensation algorithm according to the signal state, and calculate and output a control voltage compensation $V_{PI}$ according to the signal err and predetermined PI parameters Kp and Ki, the multi-modes judgment module adjusting the value of state according to the control voltage compensation V; and a PWM drive module configured to turn off the primary-side switching transistor and switch the secondary-side synchronous rectification transistor with a fixed cycle Ts$_{\_HTL}$ and a fixed duty cycle D$_{HTL}$ upon receipt of the signal Duty_SR_dynamic, the PWM drive module controlling the switching of the primary-side switching transistor in the steady-state mode by taking Ts_judge as a value of a first cycle when receiving the signal Ts_judge, the PWM drive module calculating a duty cycle of the secondary-side synchronous rectification transistor according to the signal Vo_sample to perform switching of the secondary-side synchronous rectification transistor with a same cycle as in the primary-side switching transistor, the PWM drive module performing controlling of the primary-side switching transistor by means of a peak current control method based on the signal state and the control voltage compensation V$_{PI}$ after the first cycle.

2. The system according to claim 1, wherein the digital PID module is idle in the dynamic mode, and both the dynamic control module and the load point judgment module are idle in the steady-state mode.

3. The system according to claim 1, wherein the sampling module comprising:
a comparator COMP1 having a positive terminal coupled to the signal Vsense;
a comparator COMP2 having a positive terminal coupled to the signal Vsense and a negative terminal coupled to zero level;
a waveform real-time analysis module having an input terminal coupled to output terminals of the comparator COMP1 and the comparator COMP2, a first output terminal of the waveform real-time analysis module outputting the signal Vo_sample and a second output terminal of the waveform real-time analysis module being coupled to a negative terminal of the comparator COMP1 and outputting the signal Vsample; and
a subtractor having a negative terminal coupled to the first output terminal of the waveform real-time analysis module, a positive terminal receiving the rated output voltage Vo$_{\_REF}$ and an output terminal outputting the signal err.

4. The system according to claim 1, wherein the multi-modes judgment module comprising:
a comparator COMP3 having a positive terminal receiving the signal Vomax and a negative terminal receiving the signal Vo_sample;
a comparator COMP4 having a negative terminal receiving the signal V$_{O\_REF}$ and a positive terminal receiving the signal Vo_sample;
a dynamic mode judgment module having an input terminal coupled to output terminals of the comparator COMP3 and the comparator COMP4 and an output terminal outputting a dynamic mode judgment signal mode_dynamic;
a steady-state mode judgment module configured to receive the control voltage compensation V$_{PI}$ and the signal state and having an output terminal outputting a steady state signal state_steady; and
a multi-modes state judgment module having a first input terminal coupled to the output terminal of the dynamic mode judgment module, a second input terminal coupled to the output terminal of the steady-state mode judgment module, a third input terminal coupled to the load point judgment module to obtain the signal state_judge, and an output terminal outputting the signal state.

5. The system according to claim 4, wherein a control mode is determined according to the value of the state signal state output by the multi-mode state judgment module, and the control mode is selected from the CCM, PWM, PFM, DPWM, or DPFM.

6. The system according to claim 4, wherein the load judgement module comprising: a comparator COMP5 having a positive terminal coupled to the first output terminal of the waveform real-time analysis module outputting the signal Vo_sample, a negative terminal obtaining the signal Vo$_{\_REF}$, and an output terminal outputting a reference voltage comparison signal Comp_V$_{REF}$;
a parameter calculation module configured to receive the signal mode_dynamic and the signal Vo_sample, and output a change of the sampled output voltage ΔVo_sample and a corresponding time Δt taken for the change;
a slope calculation module configured to receive the signals ΔVo_sample, Δt, and Comp_V$_{REF}$, and calculate a slope Kdown of the output voltage according to the signals ΔVo_sample and Δt; and
a step-out mode judgment module configured to be coupled to the output terminal of the slope calculation module and output the signals Ts_judge and state_judge.

7. The system according to claim 1, wherein the digital PID module comprising:
a PI parameter selection module configured to receive the signal state and select and output corresponding PI parameters Kp and Ki according to the signal state; and
a digital PI compensation algorithm module configured to receive the parameters Kp, Ki and the signal err, and obtain the control voltage compensation V$_{PI}$ according to Kp, Ki and the signal err.

8. The system according to claim 1, wherein the PWM drive module comprising:
a gating module configured to receive the signal state, and output a steady-state signal State_HTL or a dynamic state signal State_steady depending on the signal state;
a primary-side switching transistor cycle Ts calculation module configured to receive the control voltage compensation V$_{PI}$, and the signals State_steady and Ts_judge, and calculate and output a cycle signal Ts of the primary-side switching transistor;
a primary-side switching transistor duty cycle control module configured to receive the signal Ts and a primary-side peak current Ipeak and outputs a signal duty which is a primary-side switching transistor steady-state duty cycle Duty_steady when the system is in the steady-state mode, and configured to receive the signal State_HTL and output the signal duty which is a primary-side switching transistor dynamic duty cycle Duty_dynamic when the system is in the dynamic mode; and
a synchronous rectification transistor duty cycle control module configured to receive the signals State_steady and Vo_sample and output a signal Duty_SR_steady when the system is in a steady-state mode, and configured to receive the signals State_HTL and Duty_SR_dynamic and output a signal Duty_SR_dynamic when the system is in the dynamic mode.

9. The system according to claim 1, wherein the flyback switching power supply comprises a primary-side regulated flyback switching power supply.

10. The system according to claim 1, wherein the flyback switching power supply comprises an isolated flyback switching power supply in which a primary side and a secondary side of the flyback switching power supply are coupled through the primary-side winding and the secondary-side winding rather than electrically connected directly.

11. A flyback switching power supply, comprising:
a primary-side winding;
a primary-side switching transistor coupled to the primary-side winding, a secondary-side winding;
a secondary-side synchronous rectification transistor for rectifying an output voltage of the flyback switching power supply;
an auxiliary winding for providing output voltage feedback, and
a control system comprising:
  a sampling module configured to sample a resistance divided voltage Vsense of the auxiliary winding, and obtain a sampled output voltage Vo_sample according to the signal Vsense and obtain an error signal err between the signal Vo_sample and a rated output voltage Vo$_{\_REF}$;
  a multi-modes judgment module configured to receive the signal Vo_sample output by the sampling module and outputs a mode judgment signal mode_dynamic, wherein the value of the signal mode_dynamic is equal to 1 if the signal Vo_sample is greater or equal to a predetermined upper limit of output voltage Vomax, and the value of the signal mode_dynamic is equal to 0 if the signal Vo_sample is smaller than the upper limit Vomax;
  a dynamic control module configured to receive the signal mode_dynamic and output a duty cycle control signal Duty_SR_dynamic of the secondary-side synchronous rectification transistor when the signal mode_dynamic is equal to 1;
  a load point judgment module configured to receive the signal Vo_sample output by the sampling module and the signal mode_dynamic, and output a state judgment signal state_judge and a switching cycle Ts_judge when the signal Vo_sample drops to the rated output voltage Vo$_{\_REF}$, the multi-modes judgment module being configured to output a value of a state signal state corresponding to a steady-state mode upon receipt of the signal state_judge;
  a digital PID module configured to receive signals state and err and select a PID compensation algorithm according to the signal state, and calculate and output a control voltage compensation V$_{PI}$ according to the signal err and predetermined PI parameters Kp and Ki, the multi-modes judgment module adjusting the value of state according to the control voltage compensation V$_{PI}$; and
  a PWM drive module configured to turn off the primary-side switching transistor and switch the secondary-side synchronous rectification transistor with a fixed cycle Ts$_{\_HTL}$ and a fixed duty cycle D$_{HTL}$ upon receipt of the signal Duty_SR_dynamic, the PWM drive module controlling the switching of the primary-side switching transistor in the steady-state mode by taking the Ts_judge as a value of a first cycle when receiving the signal Ts_judge, the PWM drive module calculating a duty cycle of the secondary-side synchronous rectification transistor according to the signal Vo_sample to perform switching of the secondary-side synchronous rectification transistor with a same cycle as in the primary-side switching transistor, the PWM drive module performing controlling of the primary-side switching transistor by means of a peak current control method based on the signal state and the control voltage compensation V$_{PI}$ after the first cycle.

12. The flyback switching power supply according to claim 11, wherein the digital PID module is idle in the dynamic mode, and both the dynamic control module and the load point judgment module are idle in the steady-state mode.

13. The flyback switching power supply according to claim 11, wherein the sampling module comprising:
  a comparator COMP1 having a positive terminal coupled to the signal Vsense;
  a comparator COMP2 having a positive terminal coupled to the signal Vsense and a negative terminal coupled to zero level;
  a waveform real-time analysis module having an input terminal coupled to output terminals of the comparator COMP1 and the comparator COMP2, a first output terminal of the waveform real-time analysis module outputting the signal Vo_sample and a second output terminal of the waveform real-time analysis module being coupled to a negative terminal of the comparator COMP1 and outputting a signal Vsample; and
  a subtractor having a negative terminal coupled to the first output terminal of the waveform real-time analysis module, a positive terminal receiving the rated output voltage Vo$_{\_REF}$ and an output terminal outputting the signal err.

14. The flyback switching power supply according to claim 13, wherein the multi-modes judgment module comprising:
  a comparator COMP3 having a positive terminal receiving the signal Vomax and a negative terminal receiving the signal Vo_sample;
  a comparator COMP4 having a negative terminal receiving the signal V$_{O\_REF}$ and a positive terminal receiving the signal Vo_sample;
  a dynamic mode judgment module having an input terminal coupled to output terminals of the comparator COMP3 and the comparator COMP4 and an output terminal outputting a dynamic mode judgment signal mode_dynamic;
  a steady-state mode judgment module configured to receive the control voltage compensation V$_{PI}$ and the signal state and having an output terminal outputting a steady state signal state_steady; and
  a multi-modes state judgment module having a first input terminal coupled to the output terminal of the dynamic mode judgment module, a second input terminal coupled to the output terminal of the steady-state mode judgment module, a third input terminal coupled to the load point judgment module to obtain the signal state_judge, and an output terminal outputting the signal state.

15. The flyback switching power supply according to claim 14, wherein a control mode is determined according to the value of the state signal state output by the multi-mode state judgment module, and the control mode is selected from the CCM, PWM, PFM, DPWM, or DPFM.

16. The flyback switching power supply according to claim 14, wherein the load point judgement module comprising: a comparator COMP5 having a positive terminal coupled to the first output terminal of the waveform real-time analysis module outputting the signal Vo_sample a negative terminal obtaining the signal $Vo_{\_REF}$, and an output terminal outputting a reference voltage comparison signal $Comp\_V_{REF}$;

a parameter calculation module configured to receive the signals mode_dynamic and the signal Vo_sample, and output a change of the sampled output voltage ΔVo_sample and a corresponding time Δt taken for the change;

a slope calculation module configured to receive the signals ΔVo_sample, Δt, and $Comp\_V_{REF}$, and calculate a slope Kdown of the output voltage according to the signals ΔVo_sample and Δt; and a step-out mode judgment module configured to be coupled to the output terminal of the slope calculation module and output the signals Ts_judge and state_judge.

17. A control method for a flyback switching power supply, the switching power supply comprising a primary-side winding, a primary-side switching transistor coupled to the primary-side winding, a secondary-side winding, a secondary-side synchronous rectification transistor for rectifying an output voltage of the flyback switching power supply, and an auxiliary winding for providing output voltage feedback, the method comprising:

sampling a resistance divided voltage Vsense of the auxiliary winding;

obtaining a sampled output voltage Vo_sample according to the signal Vsense and an error signal err between the signal Vo_sample and a rated output voltage $Vo_{\_REF}$;

turning off a primary-side switching transistor and switching a secondary-side synchronous rectification transistor with a fixed cycle $Ts_{\_HTL}$ and a fixed duty cycle $D_{HTL}$ by a PWM drive module in a dynamic mode when Vo_sample≥Vomax, the system stepping out the dynamic mode and entering into a steady-state mode when the signal Vo_sample drops to $Vo_{\_REF}$; and obtaining a control voltage compensation $V_{PI}$ by a digital PID module by means of a PID compensation algorithm according to the signal err and predetermined PI parameters Kp and Ki in the steady-state mode, the PWM drive module calculating the cycle of the primary-side switching transistor according to the control voltage compensation $V_{PI}$ and calculating the duty cycle of the secondary-side synchronous rectification transistor according to the signal Vo_sample by means of a peak current control method so as to perform switching of the primary-side switching transistor and the secondary-side synchronous rectification transistor with same cycles.

18. The control method according to claim 17, further comprising in the dynamic mode:

obtaining the signal Vo_sample and obtaining a slope Kdown of the output voltage according to a change ΔVo_sample of the signal Vo_sample and a dropping time Δt;

obtaining a current load point according to the slope signal Kdown;

obtaining a switching cycle Ts_judge and a primary-side peak current Ipeak of the system at the time when switching from the dynamic mode to the steady-state mode; and inputting the signals Ts_judge and Ipeak to the PWM drive module, and the PWM drive module performing switching of the primary-side switching transistor by taking the signal Ts_judge as the value of a first cycle.

19. The control method according to claim 17, wherein the switching of the system from the dynamic mode to the steady-state mode is to switch to a DPFM steady-state mode.

20. The control method according to claim 17, wherein an output of the secondary side is a constant voltage output.

\* \* \* \* \*